(12) United States Patent
Lyle

(10) Patent No.: US 10,382,056 B2
(45) Date of Patent: Aug. 13, 2019

(54) FAST EVALUATION OF PREDICATES AGAINST COMPRESSED DATA

(71) Applicant: International Business Machines Corporation, Armonk, NY (US)

(72) Inventor: Robert W. Lyle, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 565 days.

(21) Appl. No.: 14/937,067

(22) Filed: Nov. 10, 2015

(65) Prior Publication Data

US 2017/0134044 A1  May 11, 2017

(51) Int. Cl.
*H03M 7/30* (2006.01)
*G06F 16/2458* (2019.01)

(52) U.S. Cl.
CPC ...... *H03M 7/3088* (2013.01); *G06F 16/2458* (2019.01); *H03M 7/3066* (2013.01)

(58) Field of Classification Search
CPC ......... G06F 17/30483; G06F 17/30501; G06F 17/30486; G06F 17/30495; G06F 17/30985
See application file for complete search history.

(56) References Cited

U.S. PATENT DOCUMENTS

| | | | |
|---|---|---|---|
| 6,691,099 B1 | 2/2004 | Mozes | |
| 8,458,354 B2 * | 6/2013 | Bremler-Barr | H03M 7/3086 709/231 |
| 8,504,510 B2 * | 8/2013 | Bremler-Barr | G06N 5/003 706/48 |
| 8,909,813 B2 * | 12/2014 | Afek | H04L 63/1416 709/247 |
| 2004/0193629 A1 | 9/2004 | Mozes | |

(Continued)

FOREIGN PATENT DOCUMENTS

| | | |
|---|---|---|
| EP | 0595064 A2 | 10/1993 |
| EP | 0747839 A1 | 6/1996 |
| EP | 0795965 A2 | 2/1997 |

OTHER PUBLICATIONS

Microsoft LIKE (Transact-SQL), https://docs.microsoft.com/en-us/previous-versions/sql/sql-server-2008-r2/ms179859(v=sql.105)(Year: 2012).*

(Continued)

*Primary Examiner* — William Spieler
(74) *Attorney, Agent, or Firm* — Erik K. Johnson

(57) ABSTRACT

Evaluating LIKE predicates against compressed data. An alphabet, a LIKE predicate, a compressed string, and a compression dictionary for the compressed string are received. Entries in the compression dictionary include a character string and an associated token. The LIKE predicate is converted to an equivalent pattern matching form, involving a search pattern of length m. For each character of the alphabet that appears in a string associated with a token, a mask of predetermined length k is created. For each entry in the compression dictionary a cumulative mask of length k is computed. A bit vector of length k is initialized, based on the search pattern. Successive tokens in the compressed string are processed using a logical shift of the bit vector and a bitwise operation of the bit vector with the cumulative mask associated with the token.

19 Claims, 3 Drawing Sheets

(56) References Cited

U.S. PATENT DOCUMENTS

2010/0049730 A1  2/2010  Qiao et al.
2015/0089134 A1  3/2015  Mukherjee et al.

OTHER PUBLICATIONS

Wu, Sun, and Udi Manber. "Fast text searching: allowing errors." Communications of the ACM 35.10 (1992): 83-91. (Year: 1992).*
Wikipedia, Sentinel Value, https://en.wikipedia.org/w/index.php?title=Sentinel value&oldid=684544619 (Year: 2015).*
Johnson et al., "Row-wise Parallel Predicate Evaluation," PVLDB '08, Aug. 23-28, 2008, pp. 622-634.
Raman et al., "DB2 with BLU Acceleration: So Much More than Just a Column Store," Proceedings of the VLDB Endowment, vol. 6, No. 11, Aug. 26-30, 2013, pp. 1080-1091.
Baeza-Yates et al., "A New Approach to Text Searching," Communications of the ACM, vol. 35, No. 10, Oct. 1992, pp. 74-82.
Kida et al., "Shift—And Approach to Pattern Matching in LZW Compressed Text", CPM'99, LNCS 1645, 1999, pp. 1-13.
Navarro et al., "Practical and Flexible Pattern Matching Over Ziv-Lempel Compressed Text", Journal of Discreet Algorithms vol. 2, 2004, pp. 347-371.
Rieger, "Rethinking Compression", http://www.ibmbigdatahub.com/blog/rethinking-compression, printed Nov. 9, 2015, 5 pages.

* cited by examiner

US 10,382,056 B2

FAST EVALUATION OF PREDICATES AGAINST COMPRESSED DATA

BACKGROUND

The present invention relates generally to the field of database query optimization, and more particularly to fast evaluation of predicates against compressed data.

A relational database is a computer-implemented database whose organization is based on the relational model of data. This model organizes data into one or more tables, or relations, of rows and columns, with a unique key for each row. Rows in a relational database are also called tuples. Generally, each entity type described in a database has its own table, the rows representing instances of that type of entity and the columns representing values attributed to that instance. Column values are also referred to as tuplets. Software systems used to maintain relational databases are known as Relational Database Management Systems (RDBMS). The relational model for database management is based on first-order predicate logic. A predicate is a statement or an expression that either holds or doesn't hold. The relational model relies on predicates to filter rows in queries. An example is the LIKE predicate, which searches for values that contain a specified character string or pattern of characters. A typical usage is:

SELECT *
FROM ZIPTABLE
WHERE ZIPCODE LIKE "9012%";

which selects all rows in ZIPTABLE with value in the ZIPCODE column starting with 9012. Most relational database systems use SQL (Structured Query Language) as the language for querying and maintaining the database.

Dictionary-based compression algorithms are lossless compression methods that, as data is scanned, create a dictionary in memory of sequences of characters, looking for repeated information. Some implementations use a static dictionary that does not have to be built dynamically. Based on pattern recognition, involving a look-up in the dictionary, a string of information is replaced by a much shorter, but uniquely identifiable, string, called a token. This results in reversible compression of the overall data. The Limpel-Ziv (LZ) algorithms are examples of dictionary-based compression schemes, of which the best known is Limpel-Ziv-Welch (LZW).

An RDBMS may employ data compression to reduce the disk storage requirements of the database. For example, IBM® DB2® 9.7 uses a variant of the LZ algorithm to compress each row of a table and IBM DB2 10.5 with BLU Acceleration supports compressed column-organized tables. These result in a substantial reduction in size; however, when evaluating predicates against the data, the reduction in size is often accompanied by an increase in the CPU time required to access the data and evaluate the predicates. Typically, the data is first decompressed, followed by the predicate analysis, but such approaches may be extremely expensive in terms of CPU use. Alternative approaches that enable LZ compression to be order-preserving may support equality and inequality comparisons, but more complex predicates such as LIKE generally require the data to be decompressed in order to be evaluated. Moreover, order-preserving approaches may reduce the compression ratios of the data.

SUMMARY

Embodiments of the present invention disclose a computer-implemented method, computer program product, and system for evaluating LIKE predicates against compressed data. An alphabet, a LIKE predicate, a compressed string, and a compression dictionary for the compressed string are received. Entries in the compression dictionary include a character string and an associated token. The LIKE predicate is converted to an equivalent pattern matching form, involving a search pattern of length m. For each character of the alphabet that appears in a string associated with a token, a mask of predetermined length k is created. For each entry in the compression dictionary a cumulative mask of length k is computed. A bit vector of length k is initialized, based on the search pattern. Successive tokens in the compressed string are processed using a logical shift of the bit vector and a bitwise operation of the bit vector with the cumulative mask associated with the token.

DETAILED DESCRIPTION

Figure 1:
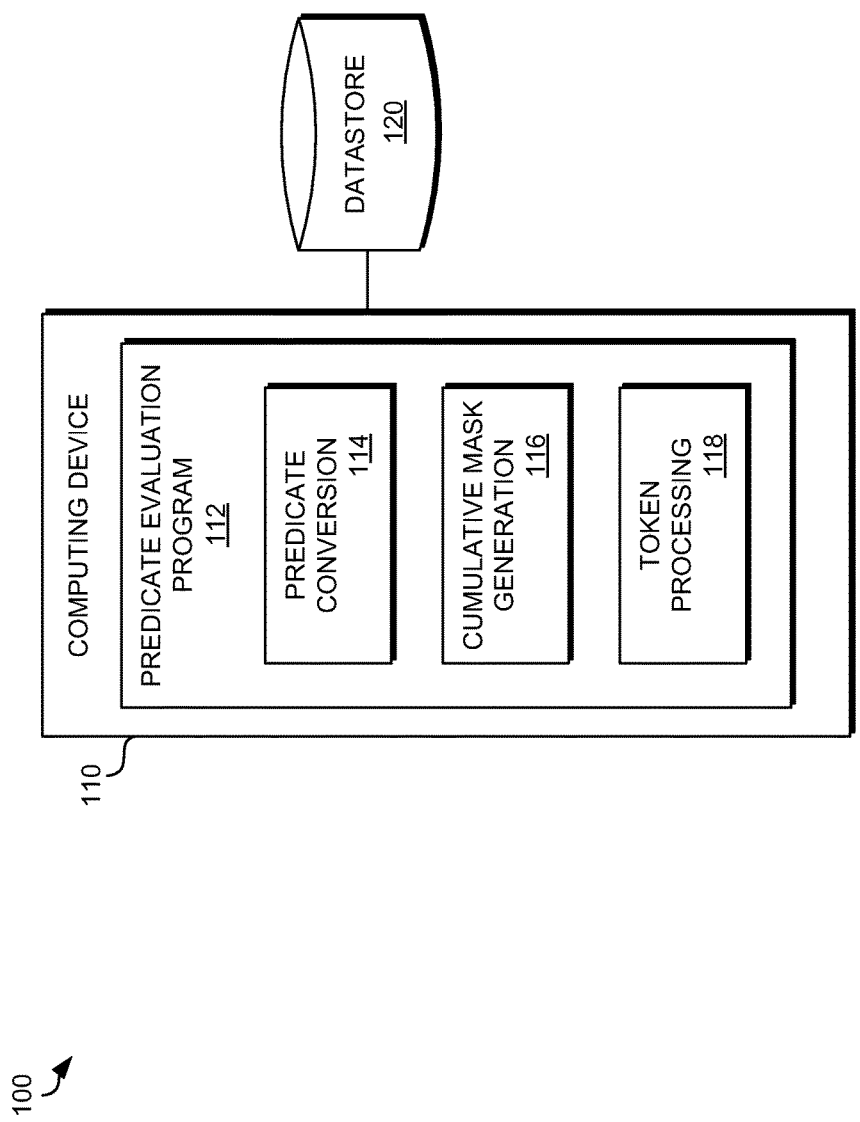
FIG. 1 is a system diagram of a predicate evaluation system, in accordance with an embodiment of the present invention.

Embodiments of the present invention disclose a computer-implemented method, computer program product, and system for evaluating the LIKE predicate, and other simple predicates formulated in terms of LIKE, directly against a dictionary-compressed relational database. Some embodiments of the invention may behave as an extension of the Baeza-Yates-Gonnet (BYG) approach to string searching. A LIKE pattern is preprocessed against a compression dictionary to produce an array of bit masks that may be used to quickly evaluate all of the characters or bytes represented by a compression dictionary entry, or token, without having to access the character data itself. After preprocessing, cumulative masks for multi-character portions of the pattern that are matched by compression tokens are precomputed. At predicate analysis time, predicates may be evaluated a token at a time, which may result in a speed of evaluation that is an order of magnitude faster than current methods.

In computer science, string searching, or string matching, algorithms attempt to find instances of a given string, or pattern, within a larger string. String matching is also called pattern matching. The strings are sequences of characters from a predefined set of characters, called an alphabet. In computer applications, the alphabet may be, for example, the set of ASCII or Unicode characters. A pattern may contain wildcards, which match one or more characters from the alphabet. For example, in SQL, the wildcard '%' in a pattern matches any sequence of zero or more characters, while the wildcard '_' matches any single character. The Baeza-Yates-Gonnet (BYG) algorithm, also known as shift-OR and shift-AND, is an example of a pattern matching algorithm for strings.

In various embodiments of the invention, a LIKE predicate is to be evaluated against input data that includes multiple values, such that matches are sought in each individual value. The values are divided by a special separator character, denoted here as <EOV> (end of value). Special characters such as <EOV> may be actual characters, printing or non-printing, or virtual characters, which may be represented in various ways, for example, as a flag in the compression dictionary token information, or as metadata. An <EOV> may also be implicit. That is, input data may be processed as if an <EOV> were present, for example, at the start and/or end of the input data. In addition, for example if values have a fixed length, <EOV> characters separating values may be implicit.

Tables 1 and 2 illustrate, by way of example, how a version of the BYG shift-OR algorithm may be extended to evaluate a LIKE predicate on uncompressed data in a relational database. The uncompressed data may represent, for example, a row in the database. The predicate to be evaluated is: (find column values) LIKE "% abc %". As the symbol '%' is a wildcard that matches any sequence of characters, this is equivalent to searching the input text for instances of the string "abc". The example input, representing a single column value, is "ababcba<EOV>", and the LIKE pattern that is sought is "% abc %". The task is transformed from find if the tuplet "ababcba" is LIKE '% abc % to the string matching task determine if the pattern "abc" occurs in the string "ababcba<EOV>". For simplicity, assume the alphabet contains only the characters {a, b, c, d, <EOV>}. Based on the search pattern "abc", the shift-OR algorithm first preprocesses the alphabet to create bit vectors, or masks, one for each character of the alphabet, including the special character <EOV>, as shown in Table 1. A 0 in a bit position indicates that a given character of the alphabet matches the corresponding position in the pattern, in reverse order. For example, for the character 'a', the associated mask has a 0 in the least significant bit (on the right), indicating that it matches the first character of the pattern. Similarly, 'b' and 'c' match the second and third bits of the search pattern, respectively, so they have 0 bits in the corresponding (reversed) positions of their masks.

TABLE 1

SHIFT-OR MASKS

| Position: | 3 | 2 | 1 |
|---|---|---|---|
| a | 1 | 1 | 0 |
| b | 1 | 0 | 1 |
| c | 0 | 1 | 1 |
| d | 1 | 1 | 1 |
| <EOV> | 1 | 1 | 1 |

Table 2, below, further illustrates how the algorithm may operate to find the pattern "abc" in the uncompressed search string "ababcba<EOV>". The algorithm first initializes a "match vector" of length 3, the length of the pattern "abc", with all 1's (row 1). It then repeatedly performs a logical shift left on the match vector, which brings a 0 into the low-order bit, and performs a logical OR of the match vector with the mask from Table 1 corresponding to the current character in the search string. For example, in Table 2, after shifting and initially OR'ing the match vector with the mask for 'a' from Table 1, there is a 0 in the low-order position (row 4). This signifies that the first character, 'a', matched the first character in the pattern. If an unmatched character is found for a position in the search string, as in row 9, the corresponding 1 in the mask will result in a 1 in the match vector, which signifies that the pattern was no longer matched up to that character. In general, after processing a character in the search string, a 0 appears in the match vector at position j (from the right) precisely when the first j characters in the pattern match the preceding j characters of the search string. Thus, if after OR'ing with the mask for the current character, there is a 0 in position m, where m is the length of the pattern (in this case 3), then a match for the pattern has been found in the search string. In this example, only when the character 'c' is processed does a 0 appear in the third bit position in the match vector (row 16) and, because the pattern is three characters in length, this means the substring "abc" has been found in the search string.

TABLE 2

SEARCH STRING IS "ababcba<EOV>"

| 1 | Initialize to 1's | 1 | 1 | 1 | |
|---|---|---|---|---|---|
| 2 | Shift in 0 | 1 | 1 | 0 | |
| 3 | Mask for 'a' | 1 | 1 | 0 | |
| 4 | OR | 1 | 1 | 0 | |
| 5 | Shift in 0 | 1 | 0 | 0 | |
| 6 | Mask for 'b' | 1 | 0 | 1 | |
| 7 | OR | 1 | 0 | 1 | |
| 8 | Shift in 0 | 0 | 1 | 0 | |
| 9 | Mask for 'a' | 1 | 1 | 0 | |
| 10 | OR | 1 | 1 | 0 | |
| 11 | Shift in 0 | 1 | 0 | 0 | |
| 12 | Mask for 'b' | 1 | 0 | 1 | |
| 13 | OR | 1 | 0 | 1 | |
| 14 | Shift in 0 | 0 | 1 | 0 | |
| 15 | Mask for 'c' | 0 | 1 | 1 | |
| 16 | OR | 0 | 1 | 1 | Match found |

In the foregoing example, only one tuplet was processed. However, input data containing multiple tuplets separated by an <EOV> character, may be processed in a similar way, using the mask for the <EOV> character given in Table 1, while keeping a running tally of tuplets containing the pattern. For example, a running tally of separators may be maintained.

Table 3 presents pseudocode for performing the shift-OR algorithm on uncompressed data. All occurrences of the given pattern are detected in the input text and a message with the position at which the match occurred is output (line 10). The symbol $b^j$ means the bit b (0 or 1) repeated j times. For example, $10^{m-1}$ means 1 followed by m−1 0's.

TABLE 3

SHIFT-OR PSEUDOCODE

| 1 | Input: text T of length n and pattern p of length m | |
|---|---|---|
| 2 | Output: all occurrences of p in T | |
| 3 | Preprocessing (compute masks): | |
| 4 | for c ∈ Σ do B[c] = $1^m$ | Initialize masks to all 1's |
| 5 | for j ∈ 1 ... m do B[$p_j$] = B[$p_j$] & $1^{m-j}0 1^{j-1}$ | Set $j^{th}$ bit to 0 for $j^{th}$ char in p |
| 6 | Searching: | Initialize match vector |
| 7 | D = $1^m$ | Process each char in T |
| 8 | for pos ∈ 1 ... n do | Shift and OR |
| 9 | D = (D << 1) | B[$t_{pos}$] | Check $m^{th}$ bit for 0 |
| 10 | if D & $10^{m-1}$ ≠ $10^{m-1}$ then output "p occurs at position pos − m + 1" | |

As mentioned, the special character <EOV> may be used to divide tuplets in a data stream. The predicate LIKE "abc %", which seeks tuplets that start with "abc", may be expressed as a string search of the form: find "<EOV>abc". Other virtual characters, such as a virtual character for a NULL value, may also be supported.

The shift-OR algorithm for uncompressed data also supports "match any character" wildcards by simply setting the corresponding bits in all masks (for non-virtual characters) to 0. In this way, no special treatment is required to support single character wildcards. For example, if the pattern was "_bc", where the first symbol '_' represents a wildcard matching any single character, the low-order bit of each mask in Table 1 would be set to 0 (excepting masks for virtual characters such as <EOV>, which have a special meaning).

As mentioned, various compression methods, including LZ, involve replacing sequences of characters or bytes with tokens or other numeric values that represent particular sequences of characters. For example, to compress tuplets such as those in the example of Tables 1 and 2, the multiply-occurring sequence "ab" might be compressed into a single token. A simple compression dictionary in this case might be as shown in Table 4.

TABLE 4

COMPRESSION DICTIONARY

| TOKEN | STRING | LENGTH |
|---|---|---|
| 1 | a | 1 |
| 2 | b | 1 |
| 3 | c | 1 |
| 4 | d | 1 |
| 5 | ab | 2 |
| 6 | <EOV> | 1 |

Using this compression dictionary, for example, the tuplet "ababcba<EOV>" would be replaced by the following sequence of tokens: 5, representing "ab"; 5, representing "ab"; 3, representing 'c'; 2, representing 'b'; 1, representing 'a'; 6 representing <EOV>.

A compression dictionary may include entries that encode virtual characters. For example, if <EOV> is represented by a virtual character, then any token that represents a recurring string in which one or more <EOV> characters are present may include information that indicates the location of the <EOV> characters in the string.

FIG. 1 is a functional block diagram of a predicate evaluation system 100, in accordance with an embodiment of the present invention. Predicate evaluation system 100 includes computing device 110. Computing device 110 represents the computing environment or platform that hosts predicate evaluation program 112. In various embodiments, computing device 110 may be a laptop computer, netbook computer, personal computer (PC), a desktop computer, or any programmable electronic device capable of hosting predicate evaluation program 112, in accordance with embodiments of the invention. Computing device 110 may include internal and external hardware components, as depicted and described in further detail below with reference to FIG. 3.

In an exemplary embodiment of the invention, computing device 110 includes predicate evaluation program 112 and datastore 120. Predicate evaluation program 112 may further include predicate conversion module 114, cumulative mask generation module 116, and token processing module 118.

Datastore 120 represents a store of data, including compressed text and/or a relational database with compressed rows or columns. Datastore 120 may also store the compression dictionary for the compressed text and/or compressed rows or columns. Datastore 120 may reside, for example, on computer readable storage media 908 (FIG. 4).

Predicate evaluation program 112 operates generally to receive a request to evaluate a LIKE predicate, or similar, against data in a compressed relational database, in accordance with an embodiment of the present invention. Predicate evaluation program 112 converts the predicate to an equivalent pattern matching form, generates cumulative masks and shift amounts for each token present in a compression dictionary, and then applies the shift amounts and cumulative masks to a match vector to search the data a token at a time for pattern matches.

Predicate conversion module 114, in an exemplary embodiment of the invention, converts a LIKE predicate to an equivalent string pattern matching form. For example, the predicate LIKE "% abc %" may be converted to the string pattern matching form find "abc"; LIKE "% abc" may be converted to find "abc<EOV>"; and LIKE "abc %" may be converted to find "<EOV>abc". The predicate LIKE "abc", which may be interpreted as tuplet="abc", may be converted to find "<EOV>abc<EOV>".

Cumulative mask generation module 116, in an exemplary embodiment of the invention, receives an alphabet, a compressed string, a compression dictionary for the string, and a search pattern, and computes cumulative masks for all tokens in the compression dictionary whose associated strings appear in the search pattern. The compressed string may be, for example, a compressed row or column in a relational database and the search pattern may be derived from a LIKE predicate by predicate conversion module 114. The compressed string may represent multiple values separated by <EOV>characters.

Rather than just preprocessing a given pattern, for example, "abc", to generate masks for single characters in the alphabet, cumulative mask generation module 116 precomputes cumulative masks representing the net effect of tokens in the compression dictionary. For all tokens, cumulative mask generation module 116 takes into account the net effect of all the characters that make up the token in computing a cumulative mask. For this purpose, cumulative mask generation module 116 first initializes a match vector of sufficient length, as explained below, to 0 bits for the lowest m−1 bit positions, and 1 bits in all higher-order bit positions. Masks for single characters are extended to the sufficient length, keeping the same m low order bits, by padding on the left with 0's. For example, with the compression dictionary of Table 4, token 5 represents the character string "ab", with length 2. If the two characters represented by token 5 were to be processed individually, the net result on the match vector would be as shown in Table 5.

TABLE 5

| TOKEN 5 REPRESENTS "ab" | | | | |
|---|---|---|---|---|
| Initialize | 1 | 1 | 0 | 0 |
| Shift in 0 | 1 | 0 | 0 | 0 |
| Mask for 'a' | 0 | 1 | 1 | 0 |
| OR | 1 | 1 | 1 | 0 |
| Shift in 0 | 1 | 1 | 0 | 0 |
| Mask for 'b' | 0 | 1 | 0 | 1 |
| OR | 1 | 1 | 0 | 1 |

Here, cumulative mask generation module 116 operates on the match vector by performing a logical shift left and a logical OR for each successive character in the string represented by the token, as is done when computing masks for uncompressed data. Alternatively, the initial shift may be eliminated and the match vector may be initialized with m low-order 0's.

The last row of Table 5 is a cumulative mask representing the net change to a match vector in processing token 5, for the above example. In a similar fashion, cumulative mask generation module 116 incorporates the net effect of each token into a cumulative mask, representing the respective net change in a match vector. In addition, cumulative mask generation module 116 computes a shift amount that represents how many characters or bytes are represented by each token. In various embodiments, due to multi-character shifts, match vectors and cumulative masks have at least $m+n-1$ bits, where n is the maximum length of any string represented by a token, and m is the pattern length. In certain embodiments, for example for fixed-length tuplets, fewer bits may suffice. For this example, the pattern length is 3 and the maximum length of a string represented by a token is 2, so a match vector will need to have at least 4 bits. For single character tokens, cumulative masks may be created as for multi-character tokens, but with only a single character is processed. For example, the mask for 'a' becomes the cumulative mask 1110. Alternatively, single character cumulative masks may be computed by padding the corresponding single character mask on the left with 1's to the desired length.

TABLE 6

CUMULATIVE MASKS

| | | | Position | | | |
|---|---|---|---|---|---|---|
| Token | String | shift | 4 | 3 | 2 | 1 |
| 1 | a | 1 | 1 | 1 | 1 | 0 |
| 2 | b | 1 | 1 | 1 | 0 | 1 |
| 3 | c | 1 | 1 | 0 | 1 | 1 |
| 4 | d | 1 | 1 | 1 | 1 | 1 |
| 5 | ab | 2 | 1 | 1 | 0 | 1 |
| 6 | <EOV> | 1 | 1 | 1 | 1 | 1 |

Table 6, above, shows the cumulative masks for the tokens in Table 4, along with their shift amount, i.e., the length of the string each token represents.

In Table 5, and in general, cumulative masks have 1's in all bits of higher order than those that could indicate a new match from the current token (e.g., for a three-character pattern and a two-character token, all bits above bit 4 will be 1's. This has the effect of automatically resetting bits that indicated matches for any previously processed tokens.

Token processing module 118, in an exemplary embodiment of the invention, utilizes the cumulative masks and the shift amounts computed by cumulative mask generation module 116 to search the compressed input string for the given search pattern. For this purpose, token processing module 118 may initialize a match vector of length at least $m+n-1$ to all 1's. For each successive token in the compressed string, a look-up in a table such as Table 6 retrieves its shift amount and cumulative mask. Token processing module 118 repeatedly logically shifts the match vector left by a number of places equal to the shift amount, such that vacant bit positions are filled with 0's, and performs a logical OR with the cumulative mask for the current token. A match is indicated when a 0 appears in the mth or higher bit of the match vector. Table 7 is an example of applying the predicate LIKE "% abc %" against the tuplet "ababcba<EOV>", i.e., find "abc" in the string "ababcba<EOV>", given the compression dictionary of Table 4.

TABLE 7

SEARCH STRING IS "ababcba<EOV>"

| | | | | | |
|---|---|---|---|---|---|
| Initialize to 1's | | 1 | 1 | 1 | 1 |
| Shift in 2 0's | Token 5 | 1 | 1 | 0 | 0 |
| Cum. Mask for "ab" | | 1 | 1 | 0 | 1 |
| OR | | 1 | 1 | 0 | 1 |
| Shift in 2 0's | Token 5 | 0 | 1 | 0 | 0 |
| Cum. Mask for "ab" | | 1 | 1 | 0 | 1 |
| OR | | 1 | 1 | 0 | 1 |
| Shift in 0 | Token 3 | 1 | 0 | 1 | 0 |
| Cum. Mask for 'c' | | 1 | 0 | 1 | 1 |
| OR | | 1 | <u>0</u> | 1 | 1 | Match found |

A match was found after processing token 3, as a 0 has appeared in the third bit of the match vector.

In various embodiments, an <EOV> may be stored as the first and/or last character of a tuple prior to processing, if not already present. In other embodiments, if an <EOV> is not present as the first and/or last character of a tuple, it is not explicitly stored, but the tuple is processed as if an <EOV> were present in these positions. That is, the tuple is considered to have an implicit <EOV> in these positions.

In various embodiments of the invention, tuples include as a first character an <EOV>. In this case, the initial match vector may be set to all 1's. In other embodiments, tuples do not begin with an explicit <EOV>, but are processed as if an initial <EOV> were present, i.e., an implicit <EOV> is assumed to be present. If the search pattern begins with an <EOV>, and an implicit <EOV> begins a tuple, the initial match vector may be set to all 1's, except for a 0 in the low-order bit, as if the implicit <EOV> had been processed explicitly.

In a further example, suppose that the compression dictionary of Table 4 includes a token 6 representing "ccc" (so that <EOV> becomes token 7). Using the mask for 'c' from Table 6 for the search pattern "abc", cumulative mask generation module 116 would generate the cumulative mask for token 6 as shown in Table 8. Note that token 6 contains a 0 bit in a bit position higher than the length of the search pattern. In all, the set of cumulative masks for the seven tokens would be as shown in Table 9.

TABLE 8

TOKEN 6 REPRESENTS "ccc"

| | | | | | |
|---|---|---|---|---|---|
| Initialize | 1 | 1 | 1 | 0 | 0 |
| Shift in 0 | 1 | 1 | 0 | 0 | 0 |
| Cum. Mask for 'c' | 0 | 0 | 0 | 1 | 1 |
| OR | 1 | 1 | 0 | 1 | 1 |
| Shift in 0 | 1 | 0 | 1 | 1 | 0 |
| Cum. Mask for 'c' | 0 | 0 | 0 | 1 | 1 |
| OR | 1 | 0 | 1 | 1 | 1 |
| Shift in 0 | 0 | 1 | 1 | 1 | 0 |
| Cum. Mask for 'c' | 0 | 0 | 0 | 1 | 1 |
| OR | 0 | 1 | 1 | 1 | 1 |

TABLE 9

CUMULATIVE MASKS

| | | | Position | | | | |
|---|---|---|---|---|---|---|---|
| Token | String | shift | 5 | 4 | 3 | 2 | 1 |
| 1 | a | 1 | 1 | 1 | 1 | 1 | 0 |
| 2 | b | 1 | 1 | 1 | 1 | 0 | 1 |
| 3 | c | 1 | 1 | 1 | 0 | 1 | 1 |
| 4 | d | 1 | 1 | 1 | 1 | 1 | 1 |
| 5 | ab | 2 | 1 | 1 | 1 | 0 | 1 |

TABLE 9-continued

CUMULATIVE MASKS

| Token | String | shift | Position | | | | |
|---|---|---|---|---|---|---|---|
| | | | 5 | 4 | 3 | 2 | 1 |
| 6 | ccc | 3 | 0 | 1 | 1 | 1 | 1 |
| 7 | <EOV> | 1 | 1 | 1 | 1 | 1 | 1 |

For example, suppose the string "ababccc<EOV>", encoded with tokens: 5, representing "ab"; 5, representing "ab"; 6, representing "ccc"; and 7 representing <EOV>, is given and the search pattern is "abc", as above. Token processing module 118 would proceed as shown in Table 10. A match vector of sufficient length is initialized to all 1's. As before, for each token encountered in the compressed data, the match vector is logically shifted left by the shift amount associated with the token, filling vacant bit positions with 0's, and a logical OR with the cumulative mask for the token is performed. A match is indicated in the last row of Table 10 by the appearance of a 0 bit in the fifth position (from the right) in the match vector.

TABLE 10

SEARCH STRING IS "ababccc<EOV>"

| Initialize to 1's | | 1 | 1 | 1 | 1 | 1 | |
| --- | --- | --- | --- | --- | --- | --- | --- |
| Shift in 2 0's | Token 5 | 1 | 1 | 1 | 0 | 0 | |
| Cum. Mask for "ab" | | 1 | 1 | 1 | 0 | 1 | |
| OR | | 1 | 1 | 1 | 0 | 1 | |
| Shift in 2 0's | Token 5 | 1 | 0 | 1 | 0 | 0 | |
| Cum. Mask for "ab" | | 1 | 1 | 1 | 0 | 1 | |
| OR | | 1 | 1 | 1 | 0 | 1 | |
| Shift in 3 0's | Token 3 | 0 | 1 | 0 | 0 | 0 | |
| Cum. Mask for "ccc" | | 0 | 1 | 1 | 1 | 1 | |
| OR | | 0 | 1 | 1 | 1 | 1 | Match found |

The 0 in the last row of Table 10 indicates that the search pattern "abc" was found, but the final character of the match was preceded by the last character of the token for "ccc" by two characters (i.e., the first 'c' of the token matched the pattern). This is because the 0 is shifted two bits beyond the third bit, and 3 was the length of the original pattern. In this way, any time a 0 appears as the mth or higher bit of the match vector, where m is the length of the pattern, the existence and location of a match are known. In this case, because the fifth bit is set, the match began four characters before the last character of the last latest token.

In an embodiment of the invention, compressed input data may include multiple tuplets separated by <EOV> characters, which may be virtual. For example, the input data may correspond to a compressed column in a relational database that includes multiple values of the same type. An entire block of compressed data may be evaluated against a LIKE predicate to find column values containing the given LIKE pattern, either by processing the individual tuplets as illustrated above, restarting after each <EOV> is encountered, or by processing the block in its entirety, along with the <EOV> characters. In both cases, a record is kept of which tuplets were found to match the search pattern.

In an embodiment of the invention, an additional bit vector, a match mask, may be used to indicate which bits should be checked for a 0, signaling that a match has been found. For example, for a search pattern of length m, a 0 would appear in the mth or higher bit to indicate a match. Thus, a match mask with 1's in the low-order m−1 bits could be used to mask off those bits that indicate that only a partial match of the pattern has been found so far. For example, for the search pattern <EOV>abc<EOV>, the match mask may be 000001111, indicating that only the last <EOV> in the search pattern needs to be checked for a match.

In a further example, a block of compressed data that includes multiple tuplets separated by virtual or physical <EOV> characters is processed, in accordance with an embodiment of the invention. The example data contains the five tuplets "abcabc", "ababc", "abc", "abcbc", and "abbc". That is, the search string is
 "abcabc<EOV>ababc<EOV>abc<EOV>abcbc<EOV>abbc<EOV>"
Table 11 shows an example compression dictionary for this string.

TABLE 11

COMPRESSION DICTIONARY

| TOKEN | STRING | LENGTH |
|---|---|---|
| 4 | a | 1 |
| 7 | b | 1 |
| 6 | c | 1 |
| 0 | <EOV> | 1 |
| 2 | ab | 2 |
| 5 | abc | 3 |
| 3 | abc<EOV> | 4 |
| 1 | bc<EOV> | 3 |

Based on this compression dictionary, the search string would be encoded as the sequence of tokens 532335121. Suppose that the predicate to evaluate is (find tuplets) LIKE "abc", which is interpreted as the equality predicate "tuplet=`abc`". The equivalent string matching task is find "<EOV>abc<EOV>". As before, the example alphabet contains {a, b, c, d, <EOV>}. For each single character of the alphabet, masks are generated as before. As the search pattern "<EOV>abc<EOV>" has length 5 and the longest entry in the compression dictionary has length 4, the masks will have length at least 8. For each character of the alphabet the mask contains all 1's in the five low-order bit positions, except for a 0 in each bit position corresponding to a match in the search pattern. The mask is then padded on the left with 0's to length at least 8. For example, the mask for 'b' may be 00011011, as 'b' matches the third character in the pattern, and the mask for <EOV> may be 00001110, as it matches the first and fifth characters of the pattern. Cumulative masks for each token are generated as described above. A match vector is initialized to 0's in the low-order m −1 bits and 1's in all higher-order bits, and for each character in the token, including <EOV>, a logical shift and a logical OR are performed. For example, for token 3, "abc<EOV>", the cumulative mask may be 11101110.

Table 12 shows the low-order eight bits of the cumulative masks for the tokens in Table 11 for the given search pattern. Any higher-order bits would be set to 1.

TABLE 12

CUMULATIVE MASKS

| Token | String | shift | Position | | | | | | | |
|---|---|---|---|---|---|---|---|---|---|---|
| | | | 8 | 7 | 6 | 5 | 4 | 3 | 2 | 1 |
| 4 | a | 1 | 1 | 1 | 1 | 1 | 1 | 1 | 0 | 1 |
| 7 | b | 1 | 1 | 1 | 1 | 1 | 1 | 0 | 1 | 1 |
| 6 | c | 1 | 1 | 1 | 1 | 1 | 0 | 1 | 1 | 1 |
| 0 | <EOV> | 1 | 1 | 1 | 1 | 0 | 1 | 1 | 1 | 0 |
| 2 | ab | 2 | 1 | 1 | 1 | 1 | 1 | 0 | 1 | 1 |
| 5 | abc | 3 | 1 | 1 | 1 | 1 | 0 | 1 | 1 | 1 |

TABLE 12-continued

CUMULATIVE MASKS

| | | | Position | | | | | | | |
|---|---|---|---|---|---|---|---|---|---|---|
| Token | String | shift | 8 | 7 | 6 | 5 | 4 | 3 | 2 | 1 |
| 3 | abc<EOV> | 4 | 1 | 1 | 1 | 0 | 1 | 1 | 1 | 0 |
| 1 | bc<EOV> | 3 | 1 | 1 | 1 | 0 | 1 | 1 | 1 | 0 |

Token processing module 118 would proceed as shown in Table 13. As the search pattern begins with an <EOV> the initial match vector has a 0 in the low-order bit position (to indicate the implicit match of an <EOV> at the start of the block of tuplets). A match is found during the processing of the third tuplet. Each time a match is found, the tuplet and the position in the tuplet is recorded. For example, a match mask, as described above, may be utilized as an aid in determining whether a match has been found.

TABLE 13

SEARCH STRING IS "abcabc<EOV>ababc<EOV>abc<EOV>abcbc<EOV>abbc<EOV>"

| | | | | | | | | | | |
|---|---|---|---|---|---|---|---|---|---|---|
| Initialize match vec | | 1 | 1 | 1 | 1 | 1 | 1 | 1 | 0 | |
| Shift in three 0's | Token 5 | 1 | 1 | 1 | 1 | 0 | 0 | 0 | 0 | |
| Token 5 cum. mask | | 1 | 1 | 1 | 1 | 0 | 1 | 1 | 1 | |
| OR | | 1 | 1 | 1 | 1 | 0 | 1 | 1 | 1 | |
| Shift in four 0's | Token 3 | 0 | 1 | 1 | 1 | 0 | 0 | 0 | 0 | |
| Token 3 cum. mask | | 1 | 1 | 1 | 0 | 1 | 1 | 1 | 0 | |
| OR | | 1 | 1 | 1 | 1 | 1 | 1 | 1 | 0 | <EOV> encountered |
| Shift in two 0's | Token 2 | 1 | 1 | 1 | 1 | 1 | 0 | 0 | 0 | Start of 2$^{nd}$ tuplet |
| Token 2 cum. mask | | 1 | 0 | 1 | 1 | 1 | 0 | 1 | 1 | |
| OR | | 1 | 1 | 1 | 1 | 1 | 0 | 1 | 1 | |
| Shift in four 0's | Token 3 | 1 | 0 | 1 | 1 | 0 | 0 | 0 | 0 | |
| Token 3 cum. mask | | 1 | 1 | 1 | 0 | 1 | 1 | 1 | 0 | |
| OR | | 1 | 1 | 1 | 1 | 1 | 1 | 1 | 0 | <EOV> encountered |
| Shift in four 0's | Token 3 | 1 | 1 | 1 | 0 | 0 | 0 | 0 | 0 | Start of 3$^{rd}$ tuplet |
| Token 3 cum. mask | | 1 | 1 | 1 | 0 | 1 | 1 | 1 | 0 | |
| OR | | 1 | 1 | 1 | 0 | 1 | 1 | 1 | 0 | Match found |
| Shift in three 0's | Token 5 | 0 | 1 | 1 | 1 | 0 | 0 | 0 | 0 | Start of 4$^{th}$ tuplet |
| Token 5 cum. mask | | 1 | 1 | 1 | 1 | 0 | 1 | 1 | 1 | |
| OR | | 1 | 1 | 1 | 1 | 0 | 1 | 1 | 1 | |
| Shift in three 0's | Token 1 | 1 | 0 | 1 | 1 | 1 | 0 | 0 | 0 | |
| Token 1 cum. mask | | 1 | 1 | 1 | 0 | 1 | 1 | 1 | 0 | |
| OR | | 1 | 1 | 1 | 1 | 1 | 1 | 1 | 0 | <EOV> encountered |
| Shift in two 0's | Token 2 | 1 | 1 | 1 | 1 | 1 | 0 | 0 | 0 | Start of 5$^{th}$ tuplet |
| Token 2 cum. mask | | 1 | 0 | 1 | 1 | 1 | 0 | 1 | 1 | |
| OR | | 1 | 1 | 1 | 1 | 1 | 0 | 1 | 1 | |
| Shift in three 0's | Token 1 | 1 | 1 | 0 | 1 | 1 | 0 | 0 | 0 | |
| Token 1 cum. mask | | 1 | 1 | 1 | 0 | 1 | 1 | 1 | 0 | |
| OR | | 1 | 1 | 1 | 1 | 1 | 1 | 1 | 0 | <EOV> encountered |

The present invention, when used with a compression scheme that encodes end of value (EOV) information as virtual information within the compressed data stream, allows for fast evaluation of compressed blocks of tuplets for many common LIKE patterns. For example, if every tuplet is followed by a special EOV character, <EOV>, then evaluating the expression column LIKE "% abc" is logically equivalent to finding all tuplets that contain the string "abc<EOV>". Similarly, evaluating column LIKE "abc %" is equivalent to finding all tuplets that contain the string "<EOV>abc", where an initial tuplet in a block is treated as if it were initially always preceded by an <EOV> character.

Single character wildcards are supported at no extra cost of evaluation, by setting the masks of the individual characters so that all characters match the character wildcard, as with the shift-OR approach for uncompressed data, described above.

A final example illustrates how a search pattern that includes wildcards may be processed, in accordance with an embodiment of the invention. The search string is the same as in Table 13. The predicate is (find tuplet) LIKE "%_ab %", which is interpreted as finding any tuplet that has "ab" present somewhere after the first two characters. This is equivalent to find "_ab". The cumulative masks are given in Table 14.

TABLE 14

CUMULATIVE MASKS

| | | | Position | | | | | | | |
|---|---|---|---|---|---|---|---|---|---|---|
| Token | String | shift | 8 | 7 | 6 | 5 | 4 | 3 | 2 | 1 |
| 4 | a | 1 | 1 | 1 | 1 | 1 | 1 | 0 | 0 | 0 |
| 7 | b | 1 | 1 | 1 | 1 | 1 | 0 | 1 | 0 | 0 |
| 6 | c | 1 | 1 | 1 | 1 | 1 | 1 | 1 | 0 | 0 |
| 0 | <EOV> | 1 | 1 | 1 | 1 | 1 | 1 | 1 | 1 | 1 |
| 2 | ab | 2 | 1 | 1 | 1 | 1 | 0 | 1 | 0 | 0 |

TABLE 14-continued

CUMULATIVE MASKS

| | | | Position | | | | | | | |
|---|---|---|---|---|---|---|---|---|---|---|
| Token | String | shift | 8 | 7 | 6 | 5 | 4 | 3 | 2 | 1 |
| 5 | abc | 3 | 1 | 1 | 1 | 0 | 1 | 1 | 0 | 0 |
| 3 | abc<EOV> | 4 | 1 | 1 | 0 | 1 | 1 | 1 | 1 | 1 |
| 1 | bc<EOV> | 3 | 1 | 1 | 0 | 1 | 1 | 1 | 1 | 1 |

The match mask, as described above, is 00000111. Token processing module 118 would proceed as shown in Table 15. The initial match vector contains all 1's.

TABLE 15

SEARCH STRING IS "abcabc<EOV>ababc<EOV>abc<EOV>abcbc<EOV>abbc<EOV>"

| | | | | | | | | | | |
|---|---|---|---|---|---|---|---|---|---|---|
| Initialize match vec | | 1 | 1 | 1 | 1 | 1 | 1 | 1 | 1 | |
| Shift in three 0's | Token 5 | 1 | 1 | 1 | 1 | 1 | 0 | 0 | 0 | Start of 1$^{st}$ tuplet |
| Token 5 cum. mask | | 1 | 1 | 1 | 0 | 1 | 1 | 0 | 0 | |
| OR | | 1 | 1 | 1 | 1 | 1 | 1 | 0 | 0 | |
| Shift in four 0's | Token 3 | 1 | 1 | 0 | 0 | 0 | 0 | 0 | 0 | |
| Token 3 cum. mask | | 1 | 1 | 0 | 1 | 1 | 1 | 1 | 1 | |
| OR | | 1 | 1 | 0 | 1 | 1 | 1 | 1 | 1 | Match found |
| Shift in two 0's | Token 2 | 0 | 1 | 1 | 1 | 1 | 1 | 0 | 0 | Start of 2$^{nd}$ tuplet |
| Token 2 cum. mask | | 1 | 1 | 1 | 1 | 0 | 1 | 0 | 0 | |
| OR | | 1 | 1 | 1 | 1 | 1 | 1 | 0 | 0 | |
| Shift in four 0's | Token 3 | 1 | 1 | 0 | 0 | 0 | 0 | 0 | 0 | |
| Token 3 cum. mask | | 1 | 1 | 0 | 1 | 1 | 1 | 1 | 1 | |
| OR | | 1 | 1 | 0 | 1 | 1 | 1 | 1 | 1 | Match found |
| Shift in four 0's | Token 3 | 1 | 1 | 1 | 1 | 0 | 0 | 0 | 0 | Start of 3$^{rd}$ tuplet |
| Token 3 cum. mask | | 1 | 1 | 0 | 1 | 1 | 1 | 1 | 1 | |
| OR | | 1 | 1 | 1 | 1 | 1 | 1 | 1 | 1 | |
| Shift in three 0's | Token 5 | 1 | 1 | 1 | 1 | 1 | 0 | 0 | 0 | Start of 4$^{th}$ tuplet |
| Token 5 cum. mask | | 1 | 1 | 1 | 0 | 1 | 1 | 0 | 0 | |
| OR | | 1 | 1 | 1 | 1 | 1 | 1 | 0 | 0 | |
| Shift in three 0's | Token 1 | 1 | 1 | 1 | 0 | 0 | 0 | 0 | 0 | |
| Token 1 cum. mask | | 1 | 1 | 0 | 1 | 1 | 1 | 1 | 1 | |
| OR | | 1 | 1 | 1 | 1 | 1 | 1 | 1 | 1 | |
| Shift in two 0's | Token 2 | 1 | 1 | 1 | 1 | 1 | 1 | 0 | 0 | Start of 5$^{th}$ tuplet |
| Token 2 cum. mask | | 1 | 1 | 1 | 1 | 0 | 1 | 0 | 0 | |
| OR | | 1 | 1 | 1 | 1 | 1 | 1 | 0 | 0 | |
| Shift in three 0's | Token 1 | 1 | 1 | 1 | 0 | 0 | 0 | 0 | 0 | |
| Token 1 cum. mask | | 1 | 1 | 0 | 1 | 1 | 1 | 1 | 1 | |
| OR | | 1 | 1 | 1 | 1 | 1 | 1 | 1 | 1 | |

A match is found during the processing of the first tuplet and another match is found during the processing of the second tuplet.

Figure 2:
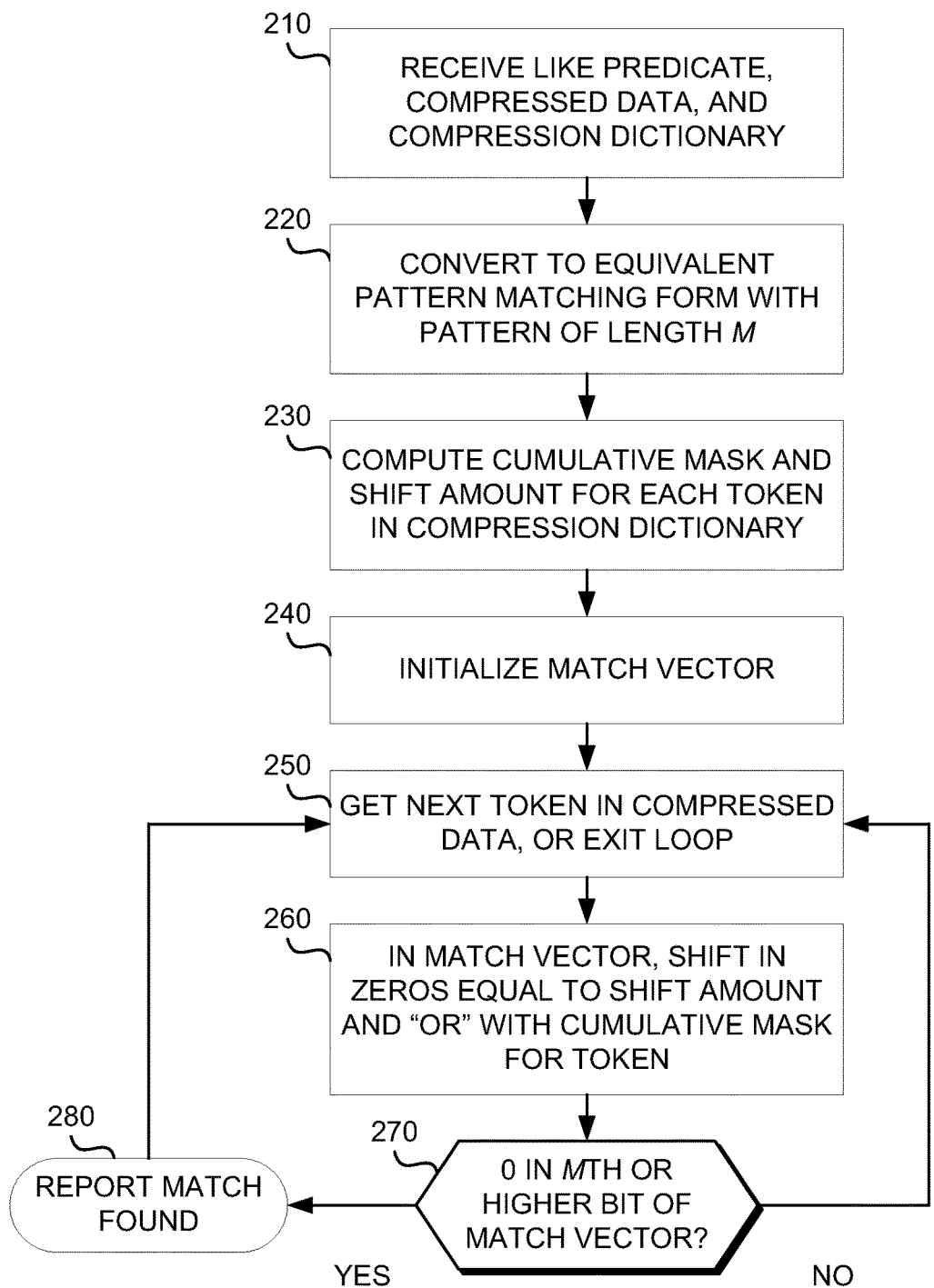
FIG. 2 is a flowchart depicting operational steps of a pattern matching program, in accordance with an embodiment of the present invention.

FIG. 2 is a flowchart depicting operational steps of predicate evaluation program 112, in accordance with an embodiment of the invention. Predicate evaluation program 112 receives a request to evaluate a LIKE predicate against compressed data in a relational database (step 210). Predicate conversion module 114 converts the predicate evaluation task to an equivalent pattern matching task, involving a search pattern of length m and a compressed search string (step 220). Based on an alphabet, the compressed string, the compression dictionary for the string, and the search pattern, cumulative mask generation module 116 computes cumulative masks and shift amounts for all tokens in the compression dictionary whose associated strings appear in the pattern (step 230). Based on the search pattern, token processing module 118 initializes a match vector of length at least m+n−1 bits, where n is the length of the longest string associated with any token (step 240). Token processing module 118 processes each successive token in the compressed string by repeatedly performing a logical shift left on the match vector by the shift amount associated with the token, followed by a logical OR with the cumulative mask associated with the token (steps 250 and 260). A 0 in the mth bit or higher of the match vector indicates that a match for the pattern has been found in the compressed string. If a match is found (decision step 270, YES branch), it is recorded (step 280) and the next token is processed (step 250). If no match is found (decision step 270, NO branch), the next token is processed (step 250).

Embodiments of the present invention presented here behave like extensions of the BYG shift-OR algorithm. However, it will be appreciated by persons of ordinary skill in the art that the equivalent BYG shift-AND algorithm could just as well have been used as a starting point, in which each logical OR is replaced by a logical AND, and 1 bits are replaced by 0 bits, and vice versa. Moreover, examples have been presented in which match vectors are shifted left, masks are padded on the left, and bit positions are numbered from right to left. Equivalently, match vectors may be shifted right, masks padded on the right, and bit positions numbered from left to right.

Figure 3:
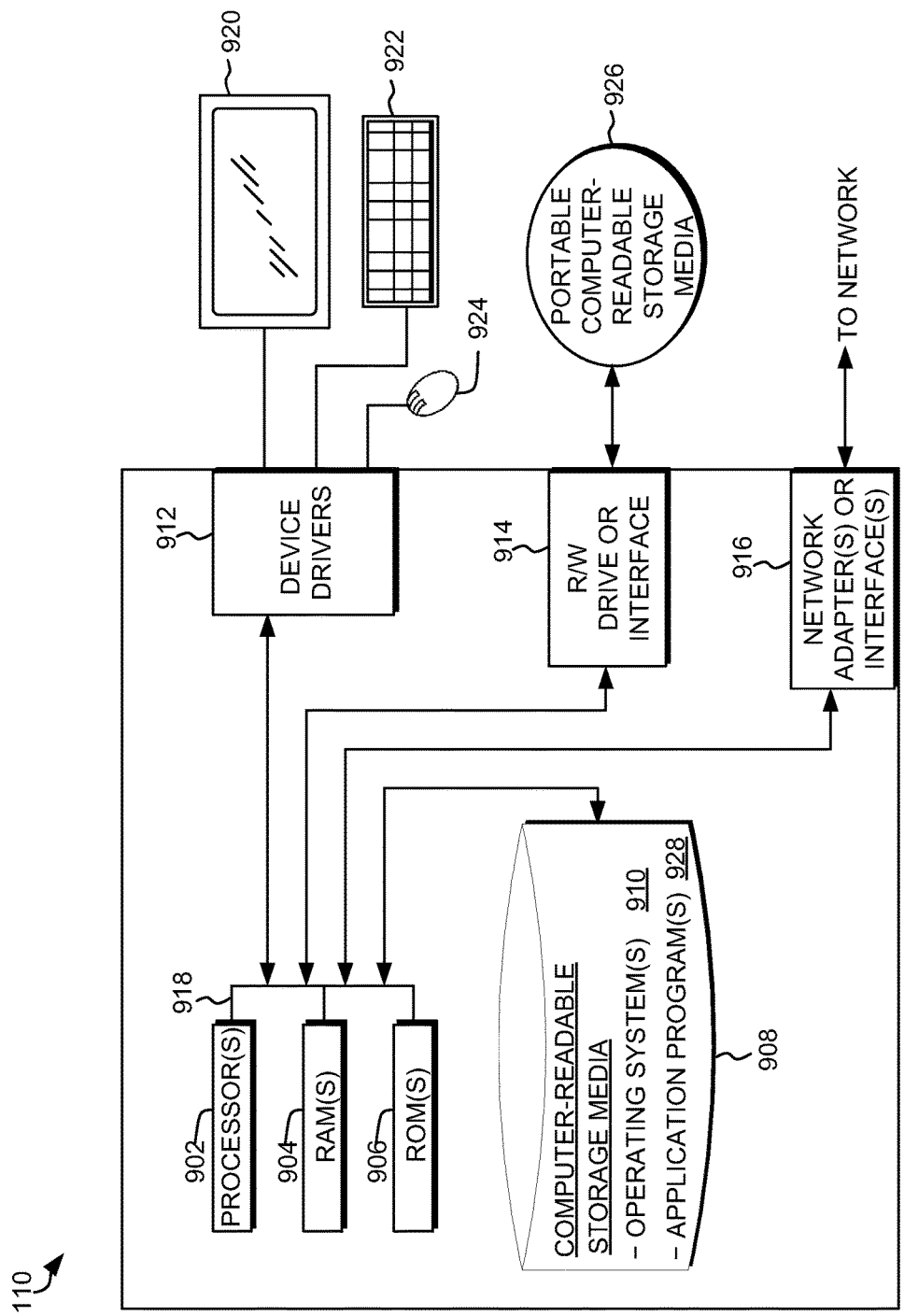
FIG. 3 is a functional block diagram illustrating a data processing environment, in accordance with an embodiment of the present invention.

FIG. 3 depicts a block diagram of components of a computing device 110, in accordance with an embodiment of the present invention. It should be appreciated that FIG. 3 provides only an illustration of one implementation and does not imply any limitations with regard to the environments in which different embodiments may be implemented. Many modifications to the depicted environment may be made.

Computing device 110 may include one or more processors 902, one or more computer-readable RAMs 904, one or more computer-readable ROMs 906, one or more computer readable storage media 908, device drivers 912, read/write drive or interface 914, network adapter or interface 916, all interconnected over a communications fabric 918. Communications fabric 918 may be implemented with any architecture designed for passing data and/or control information between processors (such as microprocessors, communications and network processors, etc.), system memory, peripheral devices, and any other hardware components within a system.

One or more operating systems 910, and one or more application programs 928, for example, ROP mitigation tool, are stored on one or more of the computer readable storage media 908 for execution by one or more of the processors 902 via one or more of the respective RAMs 904 (which typically include cache memory). In the illustrated embodiment, each of the computer readable storage media 908 may be a magnetic disk storage device of an internal hard drive, CD-ROM, DVD, memory stick, magnetic tape, magnetic disk, optical disk, a semiconductor storage device such as RAM, ROM, EPROM, flash memory or any other computer-readable tangible storage device that can store a computer program and digital information.

Computing device 110 may also include a R/W drive or interface 914 to read from and write to one or more portable computer readable storage media 926. Application programs 928 on computing device 110 may be stored on one or more of the portable computer readable storage media 926, read via the respective R/W drive or interface 914 and loaded into the respective computer readable storage media 908.

Computing device 110 may also include a network adapter or interface 916, such as a TCP/IP adapter card or wireless communication adapter (such as a 4G wireless communication adapter using OFDMA technology). Application programs 928 on computing device 110 may be downloaded to the computing device from an external computer or external storage device via a network (for example, the Internet, a local area network or other wide area network or wireless network) and network adapter or interface 916. From the network adapter or interface 916, the programs may be loaded onto computer readable storage media 908. The network may comprise copper wires, optical fibers, wireless transmission, routers, firewalls, switches, gateway computers and/or edge servers.

Computing device 110 may also include a display screen 920, a keyboard or keypad 922, and a computer mouse or touchpad 924. Device drivers 912 interface to display screen 920 for imaging, to keyboard or keypad 922, to computer mouse or touchpad 924, and/or to display screen 920 for pressure sensing of alphanumeric character entry and user selections. The device drivers 912, R/W drive or interface 914 and network adapter or interface 916 may comprise hardware and software (stored on computer readable storage media 908 and/or ROM 906).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The foregoing description of various embodiments of the present invention has been presented for purposes of illustration and description. It is not intended to be exhaustive nor to limit the invention to the precise form disclosed. Many modifications and variations are possible. Such modification and variations that may be apparent to a person skilled in the art of the invention are intended to be included within the scope of the invention as defined by the accompanying claims.

What is claimed is:

1. A computer-implemented method for evaluating LIKE predicates against compressed data, the method comprising:
   receiving, by a computer, an alphabet, a LIKE predicate, a compressed string, and a compression dictionary for the compressed string, the compression dictionary comprising entries that include a character string and an associated token, and wherein at least one character string of the entries contains an end of value character, wherein the compressed string is a compressed column of a relational database, and wherein the LIKE predicate is selected from a group of patterns consisting of: a sequence of characters and a wild card following the sequence of characters, a sequence of characters and a wild card preceding the sequence of characters, and a sequence of characters and wild cards preceding and following the sequence of characters;
   converting, by the computer, the LIKE predicate to an equivalent pattern matching form, including a search pattern;
   creating, by the computer, for each character of the alphabet that appears in a string associated with a token, a mask of a predetermined length k;
   computing, by the computer, for an entry in the compression dictionary a cumulative mask of length k;
   initializing, by the computer, a bit vector of length k;
   processing, by the computer, successive tokens in the compressed string, using a logical shift of the bit vector and a bitwise operation of the bit vector with the cumulative mask associated with the token;
   determining one or more matches between the LIKE predicate and a portion of the compressed string based on the processing of successive tokens; and
   returning tuplets relating to the location of the one or more matches in the column of the relational database.

2. A method in accordance with claim 1, wherein the search pattern is of length m, and wherein creating, by the computer, for each character of the alphabet that appears in the string associated with the token, the mask comprises:
   creating a mask of length k, such that the low-order m bit positions contain all 1 bits, except for a 0 in a bit position corresponding to a match in the search pattern, and all higher-order bit positions contain a 0 bit.

3. A method in accordance with claim 1, wherein the search pattern is of length m, and wherein computing, by the computer, for the entry in the compression dictionary, a cumulative mask comprises:
   computing a cumulative mask of length k by:
      initializing, by the computer, the cumulative mask to 0 bits in the low-order m-1 bit positions and 1 bits in all higher-order bit positions;
      for each successive character in the string associated with the token:
         shifting logically, by the computer, the cumulative mask one place and filling a vacant bit position with a 0 bit;
         performing, by the computer, a logical OR of the cumulative mask with the mask corresponding to the successive character; and
      associating, by the computer, a shift amount with the cumulative mask, equal to the length of the string associated with the entry.

4. A method in accordance with claim 1, wherein initializing, by the computer, a bit vector of length k comprises setting the bit vector to all 1 bits.

5. A method in accordance with claim 1, wherein the search pattern is of length m, and processing, by the computer, successive tokens in the compressed string comprises:
   shifting logically, by the computer, the bit vector a number of places equal to a shift amount associated with the token, filling vacant bit positions with 0 bits;
   performing, by the computer, a logical OR of the bit vector with the cumulative mask corresponding to the token; and
   in response to the bit vector having a 0 bit in the mth bit position or higher, reporting, by the computer, a match of the search pattern in the compressed string.

6. A method in accordance with claim 5, wherein the compressed string comprises multiple values divided by a separator, and wherein
   processing successive tokens in the compressed string further comprises keeping, by the computer, a tally of separators encountered; and wherein
   reporting the match of the search pattern further comprises reporting, by the computer, in which value the match occurred.

7. A method in accordance with claim 1, wherein bit positions are numbered from right to left and wherein using the logical shift comprises shifting logically left.

8. A method in accordance with claim 1, wherein bit positions are numbered from left to right and wherein using the logical shift comprises shifting logically right.

9. A computer system for evaluating LIKE predicates against compressed data, the computer system comprising:
one or more computer processors, one or more computer-readable storage media, and program instructions stored on one or more of the computer-readable storage media for execution by at least one of the one or more processors, the program instructions comprising:
program instructions to receive an alphabet, a LIKE predicate, a compressed string, and a compression dictionary for the compressed string, the compression dictionary comprising entries that include a character string and an associated token, and wherein at least one character string of the entries contains an end of value character, wherein the compressed string is a compressed column of a relational database, and wherein the LIKE predicate is selected from a group of patterns consisting of: a sequence of characters and a wild card following the sequence of characters, a sequence of characters and a wild card preceding the sequence of characters, and a sequence of characters and wild cards preceding and following the sequence of characters;
program instructions to convert the LIKE predicate to an equivalent pattern matching form, including a search pattern;
program instructions to create for each character of the alphabet that appears in a string associated with a token, a mask of a predetermined length k;
program instructions to compute for an entry in the compression dictionary a cumulative mask of length k;
program instructions to initialize a bit vector of length k;
program instructions to process successive tokens in the compressed string, using a logical shift of the bit vector and a bitwise operation of the bit vector with the cumulative mask associated with the token;
program instructions to determine one or more matches between the LIKE predicate and a portion of the compressed string based on the processing of successive tokens; and
program instructions to return tuplets relating to the location of the one or more matches in the column of the relational database.

10. A computer system in accordance with claim 9, wherein the search pattern is of length m, and wherein program instructions to create, for each character of the alphabet that appears in the string associated with the token, the mask comprise:
program instructions to create a mask of length k, such that the low-order m bit positions contain all 1 bits, except for a 0 in a bit position corresponding to a match in the search pattern, and all higher-order bit positions contain a 0 bit.

11. A computer system in accordance with claim 9, wherein the search pattern is of length m, and wherein program instructions to compute for the entry in the compression dictionary, a cumulative mask comprise:
program instructions to compute a cumulative mask of length k by:
initializing the cumulative mask to 0 bits in the low-order m-1 bit positions and 1bits in all higher-order bit positions;
for each successive character in the string associated with the token:
shifting logically the cumulative mask one place and filling a vacant bit position with a 0 bit;
performing a logical OR of the cumulative mask with the mask corresponding to the successive character; and
associating a shift amount with the cumulative mask, equal to the length of the string associated with the entry.

12. A computer system in accordance with claim 9, wherein program instructions to initialize a bit vector of length k comprise program instructions to set the bit vector to all 1 bits.

13. A computer system in accordance with claim 9, wherein the search pattern is of length m, and program instructions to process successive tokens in the compressed string comprise:
program instructions to shift logically the bit vector a number of places equal to a shift amount associated with the token, filling vacant bit positions with 0 bits;
program instructions to perform a logical OR of the bit vector with the cumulative mask corresponding to the token; and
program instructions, in response to the bit vector having a 0 bit in the mth bit position or higher, to report a match of the search pattern in the compressed string.

14. A computer system in accordance with claim 13, wherein the compressed string comprises multiple values divided by a separator, and wherein
program instructions to process successive tokens in the compressed string further comprise program instructions to keep a tally of separators encountered; and wherein
program instructions to report the match of the search pattern further comprise program instructions to report in which value the match occurred.

15. A computer system in accordance with claim 9, wherein bit positions are numbered from right to left and wherein program instructions to use the logical shift comprise program instructions to shift logically left.

16. A computer system in accordance with claim 9, wherein bit positions are numbered from left to right and wherein program instructions to use the logical shift comprise program instructions to shift logically right.

17. A computer program product for evaluating LIKE predicates against compressed data, the computer program product comprising:
one or more computer-readable storage media and program instructions stored on the one or more computer-readable storage media, the program instructions comprising:
program instructions to receive an alphabet, a LIKE predicate, a compressed string, and a compression dictionary for the compressed string, the compression dictionary comprising entries that include a character string and an associated token, and wherein at least one character string of the entries contains an end of value character, wherein the compressed string is a compressed column of a relational database, and wherein the LIKE predicate is selected from a group of patterns consisting of: a sequence of characters and a wild card following the sequence of characters, a sequence of characters and a wild card preceding the sequence of characters, and a sequence of characters and wild cards preceding and following the sequence of characters;
program instructions to convert the LIKE predicate to an equivalent pattern matching form, including a search pattern;
program instructions to create for each character of the alphabet that appears in a string associated with a token, a mask of a predetermined length k;
program instructions to compute for an entry in the compression dictionary a cumulative mask of length k;

program instructions to initialize a bit vector of length k;

program instructions to process successive tokens in the compressed string, using a logical shift of the bit vector and a bitwise operation of the bit vector with the cumulative mask associated with the token;

program instructions to determine one or more matches between the LIKE predicate and a portion of the compressed string based on the processing of successive tokens; and program instructions to return tuplets relating to the location of the one or more matches in the column of the relational database.

18. A computer program product in accordance with claim 17, wherein the search pattern is of length m, and program instructions to process successive tokens in the compressed string comprise:

program instructions to shift logically the bit vector a number of places equal to a shift amount associated with the token, filling vacant bit positions with 0 bits;

program instructions to perform a logical OR of the bit vector with the cumulative mask corresponding to the token; and program instructions, in response to the bit vector having a 0 bit in the mth bit position or higher, to report a match of the search pattern in the compressed string.

19. A computer program product in accordance with claim 18, wherein the compressed string comprises multiple values divided by a separator, and wherein program instructions to process successive tokens in the compressed string further comprise program instructions to keep a tally of separators encountered; and wherein program instructions to report the match of the search pattern further comprise program instructions to report in which value the match occurred.

* * * * *